United States Patent
Chiu et al.

(10) Patent No.: US 12,224,248 B2
(45) Date of Patent: Feb. 11, 2025

(54) SEMICONDUCTOR WAFER AND SEMICONDUCTOR DIES FORMED THEREFROM INCLUDING GROOVES ALONG LONG EDGES OF THE SEMICONDUCTOR DIES

(71) Applicant: WESTERN DIGITAL TECHNOLOGIES, INC., San Jose, CA (US)

(72) Inventors: Chin-Tien Chiu, Taichung (TW); Jia Li, Shanghai (CN); Dongpeng Xue, Shanghai (CN); Huirong Zhang, Shanghai (CN); Guocheng Zhong, Shanghai (CN); Xiaohui Wang, Shanghai (CN); Hua Tan, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 390 days.

(21) Appl. No.: 17/688,099

(22) Filed: Mar. 7, 2022

(65) Prior Publication Data

US 2023/0282594 A1 Sep. 7, 2023

(51) Int. Cl.
| | |
|---|---|
| *H01L 23/544* | (2006.01) |
| *H01L 25/065* | (2023.01) |
| *H10B 41/20* | (2023.01) |
| *H10B 43/20* | (2023.01) |

(52) U.S. Cl.
CPC ........ *H01L 23/544* (2013.01); *H01L 25/0657* (2013.01); *H01L 2223/5446* (2013.01); *H01L 2223/5448* (2013.01); *H01L 2225/06506* (2013.01); *H01L 2225/0651* (2013.01); *H01L 2225/06562* (2013.01); *H10B 41/20* (2023.02); *H10B 43/20* (2023.02)

(58) Field of Classification Search
CPC .............. H01L 23/544; H01L 25/0657; H01L 2223/5446; H01L 2223/5448; H01L 2225/06506; H01L 2225/0651; H01L 2225/06562; H01L 21/78; H01L 25/0652; H01L 25/50; H01L 21/6836; H01L 23/562; H01L 2221/68327; H10B 41/20; H10B 43/20
See application file for complete search history.

(56) References Cited

U.S. PATENT DOCUMENTS

| | | | |
|---|---|---|---|
| 8,883,614 B1* | 11/2014 | Lei | ............. H01L 21/78 438/464 |
| 10,418,334 B2* | 9/2019 | Zhang | ............ H01L 21/78 |
| 2006/0226434 A1* | 10/2006 | Hata | ............ H01L 33/32 257/94 |
| 2009/0189257 A1* | 7/2009 | Seki | ............ H01L 29/0603 438/700 |

(Continued)

*Primary Examiner* — Douglas W Owens
(74) *Attorney, Agent, or Firm* — Pearl Cohen Zedek Latzer Baratz LLP

(57) ABSTRACT

A semiconductor wafer includes semiconductor dies and laser grooves formed in the scribe lines along the long edges of the semiconductor dies. A laser groove extends between the long edges of two adjacent semiconductor dies to encompass the corners of the two adjacent semiconductor dies. When diced, the resulting semiconductor dies have portions of the corners removed.

15 Claims, 8 Drawing Sheets

(56) References Cited

U.S. PATENT DOCUMENTS

| | | | |
|---|---|---|---|
| 2014/0346641 A1* | 11/2014 | Lei | H01L 21/82 |
| | | | 257/620 |
| 2015/0243558 A1* | 8/2015 | Anselm | H01S 5/0203 |
| | | | 438/462 |
| 2018/0269162 A1* | 9/2018 | Takahashi | H01L 29/0619 |
| 2020/0312715 A1* | 10/2020 | Choi | H01L 21/76838 |
| 2021/0202436 A1* | 7/2021 | Yeh | H01L 25/0655 |
| 2021/0375826 A1* | 12/2021 | Chen | H01L 23/3135 |
| 2022/0336412 A1* | 10/2022 | Yeh | H01L 24/94 |

* cited by examiner

SEMICONDUCTOR WAFER AND SEMICONDUCTOR DIES FORMED THEREFROM INCLUDING GROOVES ALONG LONG EDGES OF THE SEMICONDUCTOR DIES

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, cellular telephones and SSDs (Solid State Drives).

Semiconductor memory may be provided within a semiconductor package, which protects the semiconductor memory and enables communication between the memory and a host device. Examples of semiconductor packages include system-in-a-package (SiP) or multichip modules (MCM), where a plurality of dies are mounted and interconnected on a small footprint substrate.

Semiconductor dies are typically batch processed together in a semiconductor wafer. Once the integrated circuits have been defined on the individual dies, the dies are diced from the wafer and removed for mounting within a package. Stealth dicing before grinding (occasionally referred to herein as "SDBG") is a dicing technology, where laser pulses are focused between the top and bottom surfaces of the wafer in rows and columns defining the outlines of the individual semiconductor dies. Subsequent mechanical perturbations, such as occur during the wafer backgrind process, cause the wafer to fracture cleanly along the rows and columns defining the semiconductor die outlines.

While SDBG offers certain process efficiencies, SDBG has one disadvantage in that it may lead to cracking of the individual semiconductor dies at the corners. In particular, during the mechanical backgrind process, where the grinding wheel passes over individual semiconductor dies which have already been separated, the dies can crash into each other, at times causing chipping or cracking at the corners. One reason for this is that SiO/SiN layers (referred to as ONON layers) are formed in the scribe lines during wafer fabrication for process or test use. The ONON layers disrupt the clean fracture of the wafer during SDBG, and can cause cracking in the scribe lines which can propagate to the active regions of the dies. While the dies are mounted on a tape during the backgrind process, the tape allows some degree of movement between the dies, and this small movement may be enough to result in the chipping and cracking described above.

It is therefore known to form recesses at the corners of dies in the wafer using a laser. While this solves the problem of die crash during backgrind, it causes another problem in that the laser causes heat-affected zones, or HAZ. HAZ are the areas of the wafer to either side of the portions removed by the laser. These HAZ areas have not melted but have had their microstructure and properties altered and weakened. These areas can crack, for example along an edge of a die overhanging empty space that gets stressed during portions of the packaging process.

DETAILED DESCRIPTION

The present technology will now be described with reference to the figures, which in embodiments, relate to a semiconductor wafer including semiconductor dies and laser grooves formed in the scribe lines along the long edges of the semiconductor dies. A laser groove extends between the long edges of two adjacent semiconductor dies to encompass the corners of the two adjacent semiconductor dies. This prevents die cracking, for example during backgrind of the wafer. Moreover, the absence of laser grooves along the short edges of the semiconductor dies prevents die cracking, for example along short edges of dies overhanging empty space that are stressed during portions of the packaging process.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application.

In one embodiment, the acceptable manufacturing tolerance is ±1.5 mm, or alternatively, ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

Figure 1:
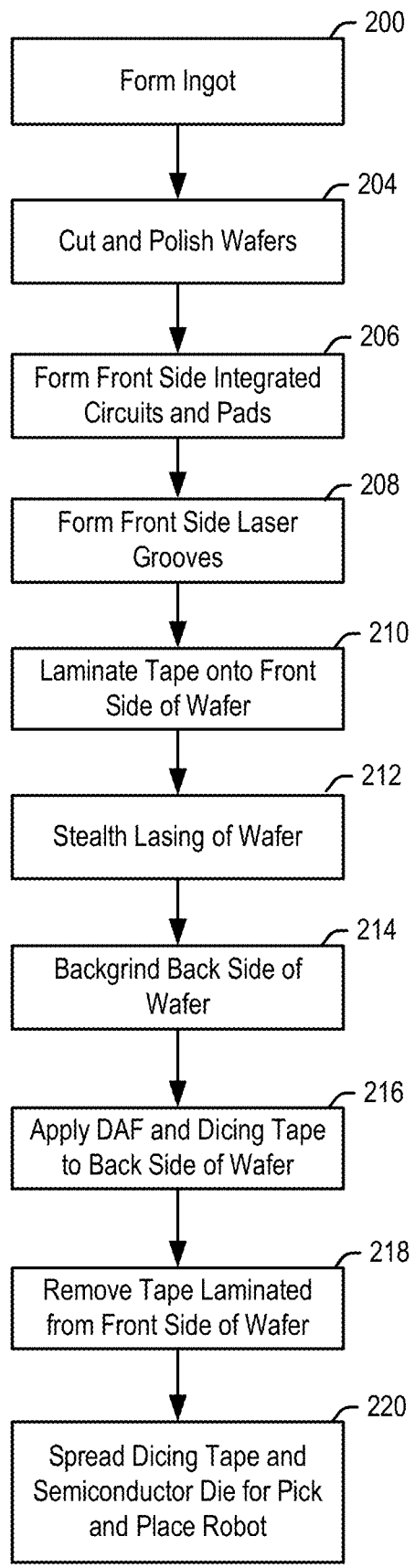
FIG. 1 is a flowchart for forming a wafer with semiconductor dies and laser grooves according to embodiments of the present technology.

An embodiment of the present technology will now be explained with reference to the flowchart of FIG. 1, and the views of FIGS. 2-12. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 204, the semiconductor wafer 100 may be cut from an ingot and polished on both the first major surface 102 (FIG. 2), and second major surface 104 (FIG. 7) opposite surface 102, to provide smooth parallel surfaces. In step 206, the first major surface 102 may undergo various processing steps to divide the wafer 100 into respective semiconductor dies 106 (one of which is numbered in FIGS. 2 and 3), and to form integrated circuits of the respective semiconductor dies 106 in active areas of the dies on and/or in the first major surface 102. These various processing steps may include photolithographic steps and metallization steps depositing metal contacts for transferring signals to and from the integrated circuits. The electrical contacts may include die bond pads 108 (one of which is numbered in FIGS. 2 and 3) exposed on the first major surface 102. The die bond pads 108 may be formed along one of the long edges of the semiconductor dies 106.

Figure 2:
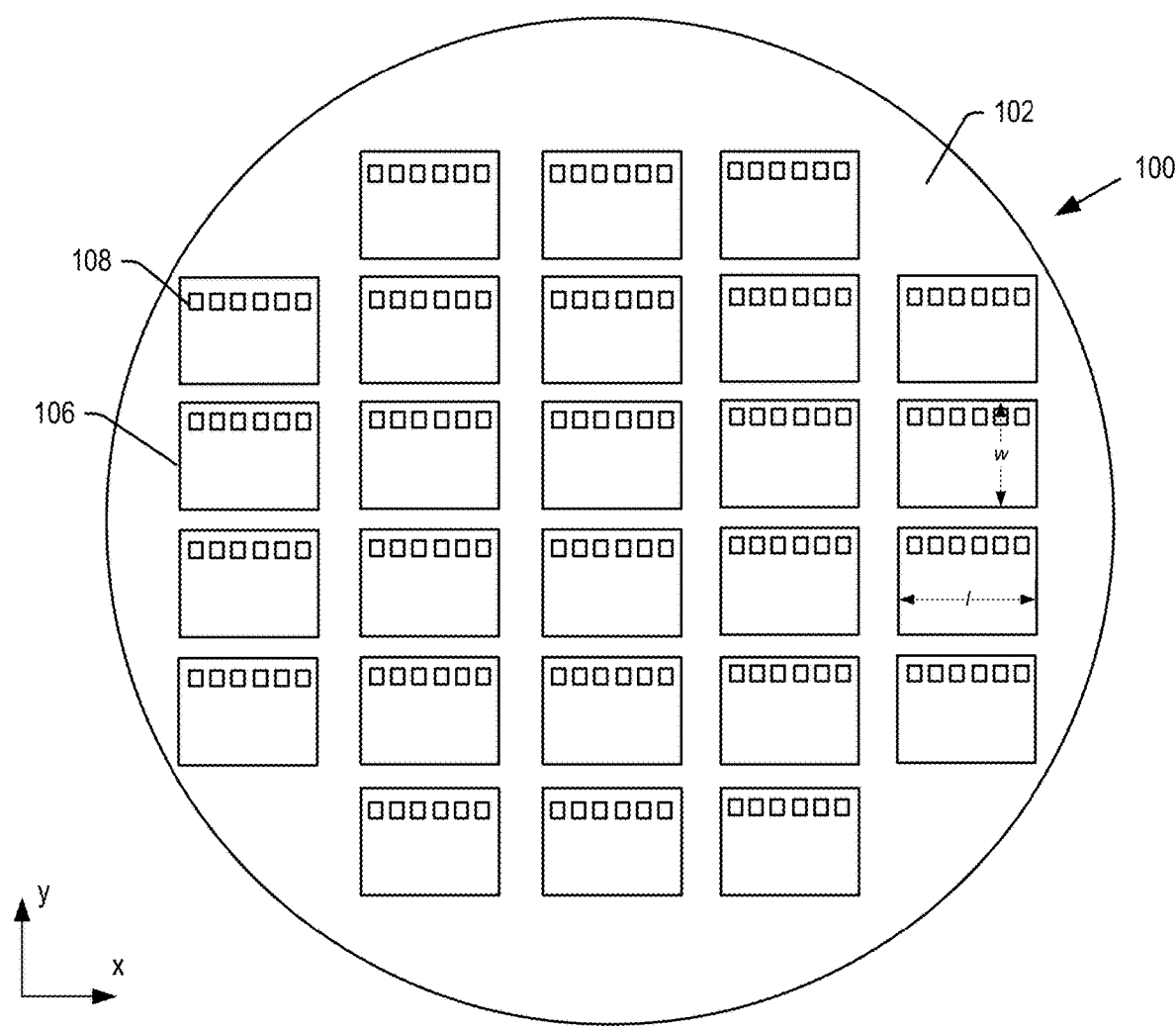
FIG. 2 is a front view of a semiconductor wafer showing a first major surface of the wafer.
Figure 3:
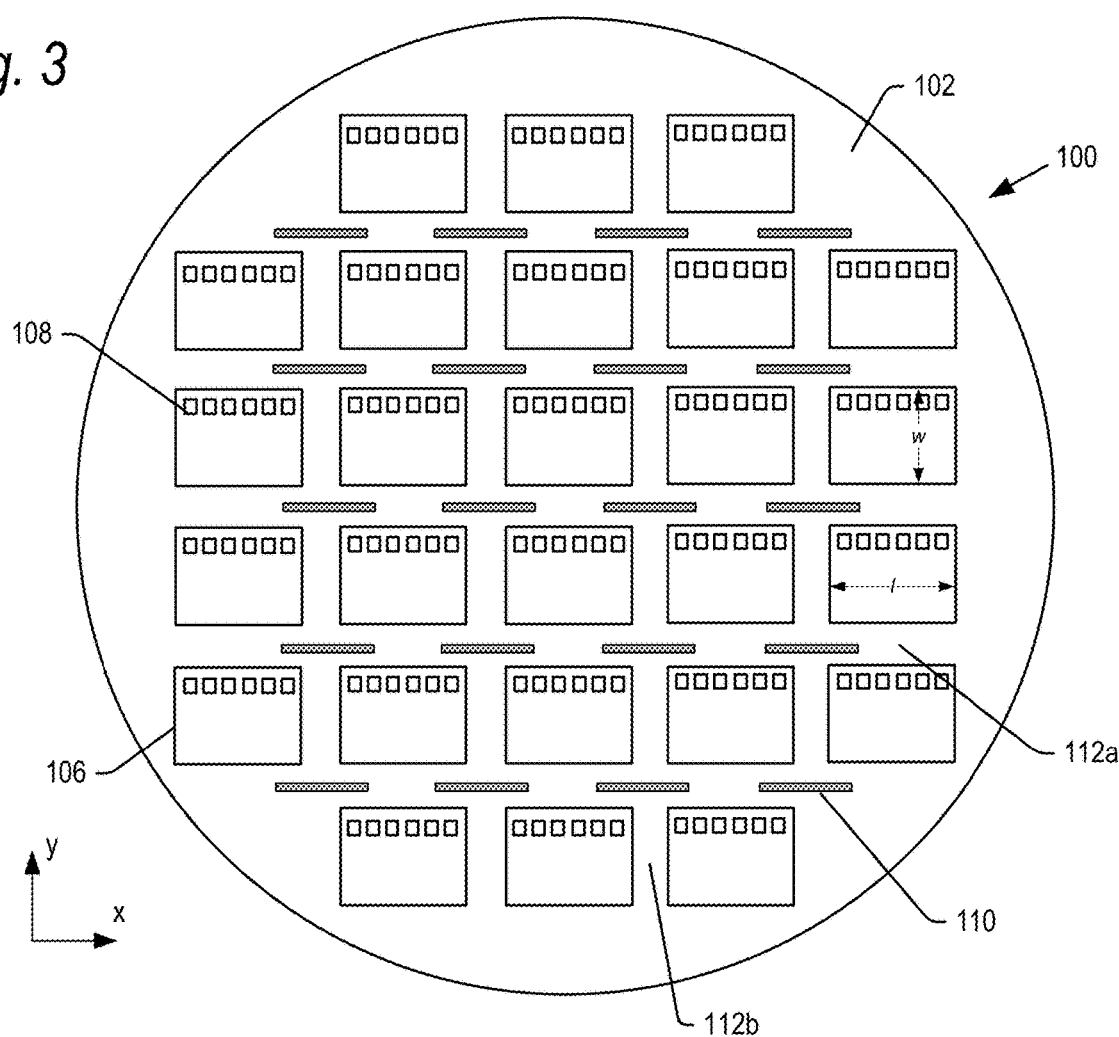
FIG. 3 is a front view of a semiconductor wafer including laser grooves according to embodiments of the present technology.

The number of semiconductor dies 106 shown on wafer 100 in FIGS. 2 and 3 is for illustrative purposes, and wafer 100 may include more semiconductor dies 106 than are shown. Similarly, the number of bond pads 108 shown on each semiconductor die 106 on wafer 100 in FIGS. 2 and 3 is for illustrative purposes, and each die 106 may include more die bond pads than are shown. The die bond pads 108 may for example be formed of aluminum, or alloys thereof, but the pads 108 may be formed of other materials in further embodiments. In embodiments, the integrated circuits may be configured as flash memory such as 2D NAND flash memory or 3D BiCS (Bit Cost Scaling), V-NAND or other 3D flash memory, though other types of integrated circuits are contemplated.

As shown in FIGS. 2 and 3, the semiconductor dies 106 may have length, l, along the x-direction and a width, w, in the y-direction. The length l of the semiconductor dies is longer than the width w of the semiconductor dies. As used herein, the long side or long edge of dies 106 refers to the length l of the dies, and the short side or short edge of dies 106 refers to the width w of the dies. As noted, the contact pads 108 are located along a long edge of the semiconductor dies 106.

In accordance with aspects of the present technology, before or after the integrated circuits and contact pads of the semiconductor dies 106 have been formed, laser grooves 110 (one of which is numbered in FIG. 3) may be formed in the kerf area (also referred to as scribe lines) 112 adjacent semiconductor dies 106 in step 208. The kerf area 112 is reserved as a boundary around active areas of the semiconductor dies where a dicing cut may be made to separate the semiconductor dies from each other and the wafer 100. As such, the kerf area 112 does not form part of the active area of semiconductor dies 106 usable to form integrated circuits.

However, as noted in the Background section, ONON layers may be formed in the kerf area, which ONON layers can interfere with the SDBG step and cause die cracks. The laser grooves 110 may be formed in major surface 102, i.e., the same surface within which the integrated circuits of dies 106, and the ONON layers, are formed. The laser grooves 110 effectively remove the ONON layers in the kerf area along the length of the laser grooves to remove the ONON layers as a source of cracking in the area of the laser grooves.

Figure 4:
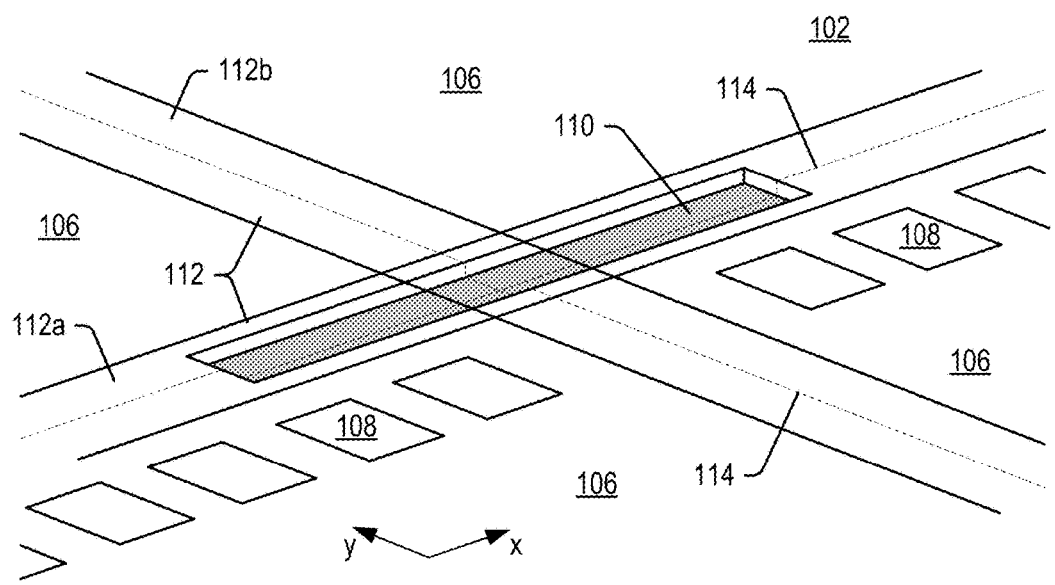
FIG. 4 is an enlarged perspective view of a portion of the wafer showing a laser groove according to embodiments of the present technology.

FIG. 4 is an enlarged view of a laser groove 110 in kerf area 112. Kerf area 112 may include horizontal scribe lines 112a oriented along the x-axis, and vertical scribe lines 112b oriented along the y-axis. In accordance with aspects of the present technology, the laser grooves 110 are formed in scribe lines 112a, and are not formed in scribe lines 112b (except where the scribe lines 112a intersect with and crossover scribe lines 112b). In embodiments where the wafer 100 is diced by stealth laser dicing as explained below, the scribe lines 112a and 112b may each be about 7 µm wide, though one or both may be wider or narrower than that in further embodiments of stealth laser dicing. Where the wafer 100 is diced by other technologies such as sawing, the kerf width may be wider, such as for example 70 µm or 170 µm. The scribe lines 112a, 112b may have these or other widths in different embodiments.

The length of each laser groove 110 may be 1400 µm to 1800 µm, such as for example 1600 µm. The length of the laser groove 110 may be longer or shorter than this in further embodiments. However, as explained below, this range has been determined to be the optimal balancing of countervailing factors. Each horizontal laser groove 110 may be centered around its intersecting vertical scribe line 112b.

As explained below, after the backgrind step, the wafer 100 may have a final thickness of between 25 µm and 102 µm. In embodiments, the depth of the laser groove 110 is at least as great as the final thickness of the wafer 100. As the depth of the laser groove 110 is greater than or equal to the final thickness of the wafer, the backgrind step will remove all of the wafer material beneath the laser groove 110, in effect converting the laser groove 110 into a notch at portions of the long edges of the dies 106. However, as explained below, the depth of laser groove 110 may be less than the final thickness of the wafer 100 after thinning in further embodiments.

As explained below, embodiments of the present technology use stealth dicing before grinding (SDBG), which is a precise cutting method that removes little of the wafer when dicing the wafer. FIG. 4 further shows vertical and horizontal SDBG separation lines 114 indicating the dicing lines along which dies 106 will be cut from wafer 100. As shown, the dies 106 will be cut so that portions of the scribe lines 112a, 112b remain as a border around the active area of each semiconductor die. The laser grooves 110 remove a portion of the border on the long edges of the dies 106 around the active area.

Additionally, as shown, the SDBG separation lines may bisect the laser groove 110 in the horizontal scribe lines 112a (though they may not evenly bisect the laser groove 110 in further embodiments). Thus, the four dies 106 shown in FIG. 4 will each have a portion of the laser groove 110 upon dicing from the wafer 100 as explained below. The laser groove 110 is shown in FIG. 4 as taking up a portion of the width of scribe line 112*a*, such as for example 50% to 80% of the width of the scribe line 112*a*. However, in further embodiments, the laser groove 110 may take up 100% of the width of the scribe line 112*a*.

Figure 5:
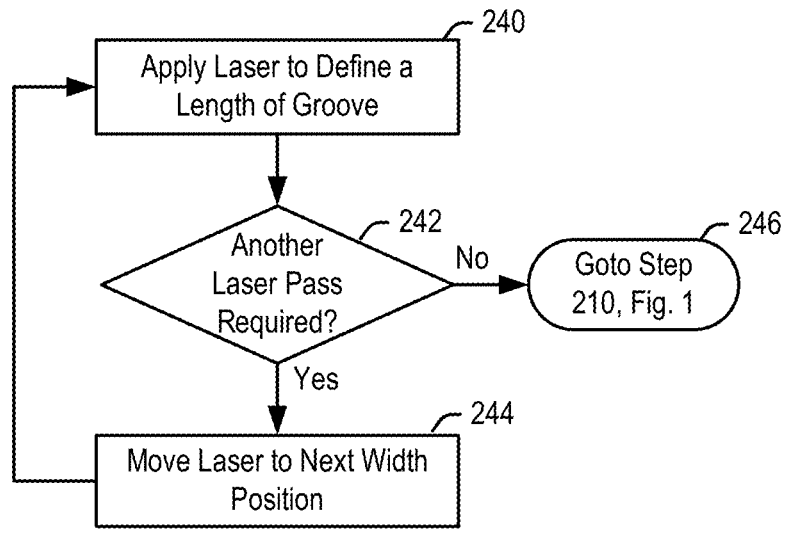
FIGS. 5 and 6 are flowcharts illustrating methods for forming the grooves in the wafer according to different embodiments of the present technology.
Figure 6:
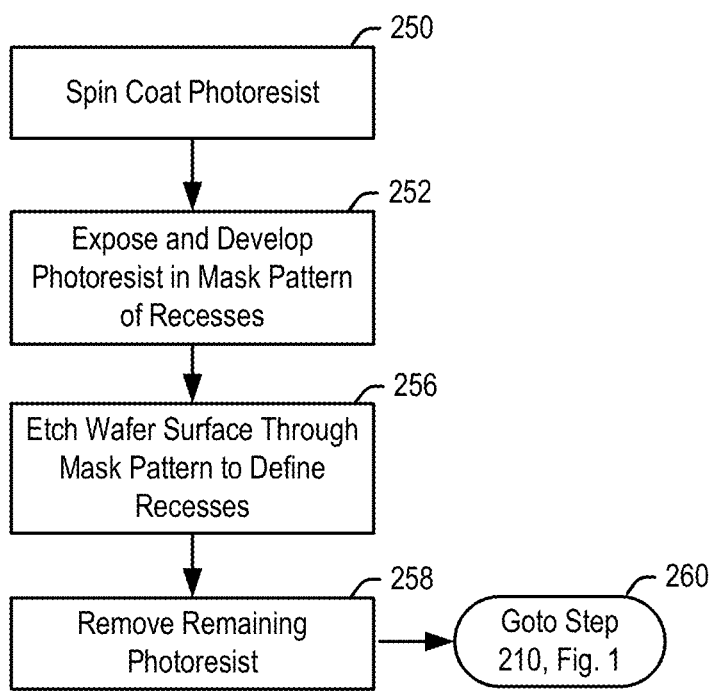

The groove 110 shown in FIG. 4 may be formed by different processes, some of which will now be explained with reference to the flowcharts of FIGS. 5 and 6. Referring initially to FIG. 5, the laser groove 110 may be formed in step 208 using a single narrow laser, such as for example a laser saw model DFL 7160 from Disco Corporation, Tokyo, Japan. The laser groove 110 may be formed by other types of lasers in further embodiments. In step 240, the laser may be energized and moved to define the length of the laser groove 110. The diameter of the laser cut may be narrower than the final desired width of the laser groove 110. Thus, if further passes of the laser are required in step 242 to fill out the desired width of the laser groove 110, the laser position is shifted, and the laser is again energized to move along the length of the laser groove 110. If no additional passes are required in step 242, the fabrication of wafer 100 continues in step 246. In one embodiment, the laser may be a 2.2 W power laser, which moves at 60 mm/s and operates at a frequency of 100 kHz. These parameters are by way of example only, and each parameter may vary in further embodiments.

While grooves 110 may be formed by a laser and as such is generally referred to herein as laser grooves, it is understood that the grooves 110 may be formed by other processes. FIG. 6 illustrates a further process of step 208, where the grooves 110 are formed by photolithography. In step 250, a layer of photoresist is spin coated onto the major surface 102. In step 252, the photoresist layer may be exposed and developed to form a mask pattern defining the positions of the grooves 110 on the wafer 100, using the known positions and borders of the semiconductor dies 106 on the wafer. In step 256, the wafer surface 102 may be etched through the mask pattern to define the grooves 110. In step 258 the remaining photoresist may be chemically removed, and fabrication of wafer 100 continues in step 260.

Figure 7:
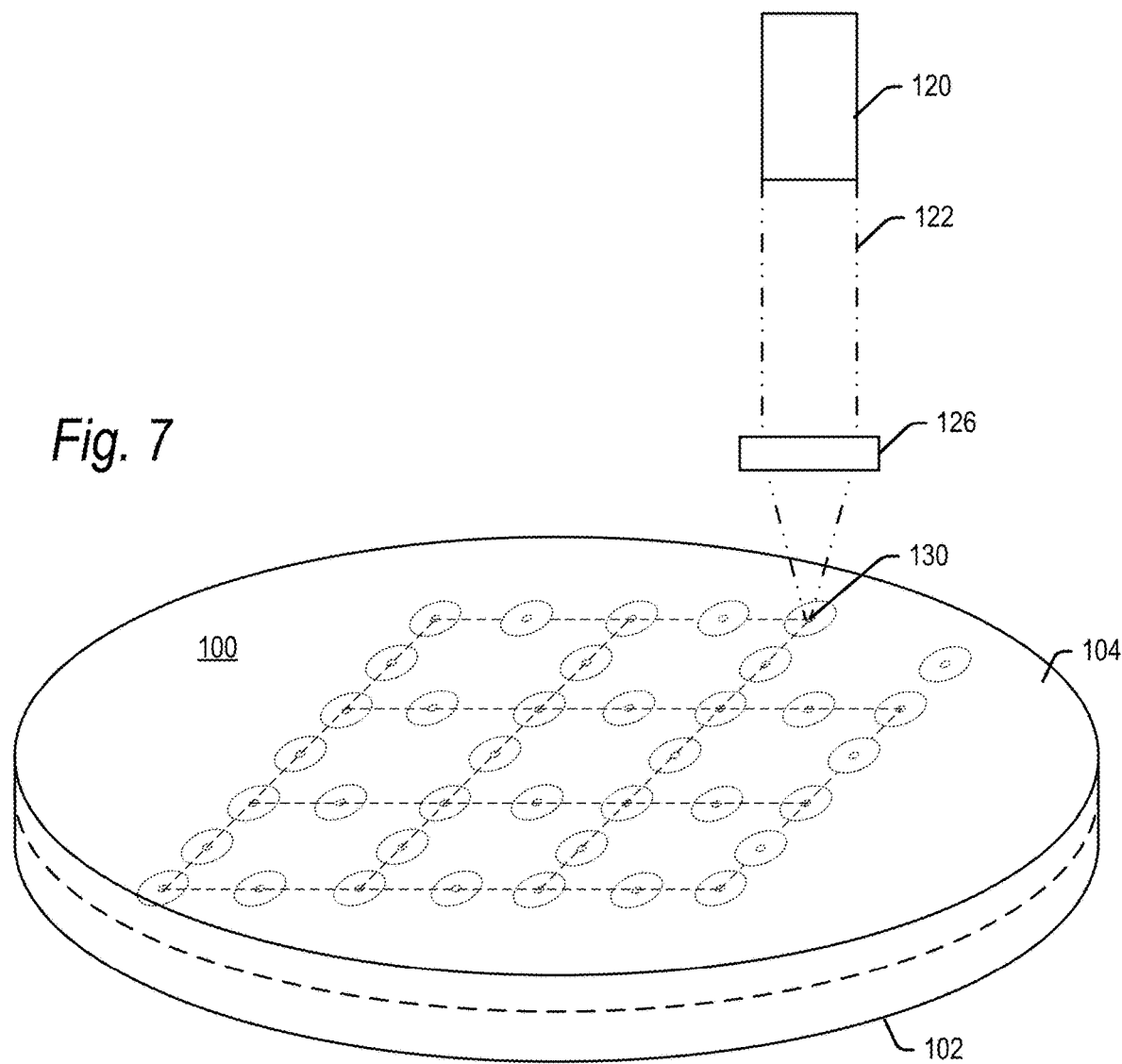
FIGS. 7 and 8 illustrate a stealth dicing before grinding laser process for dicing the semiconductor wafer.
Figure 8:
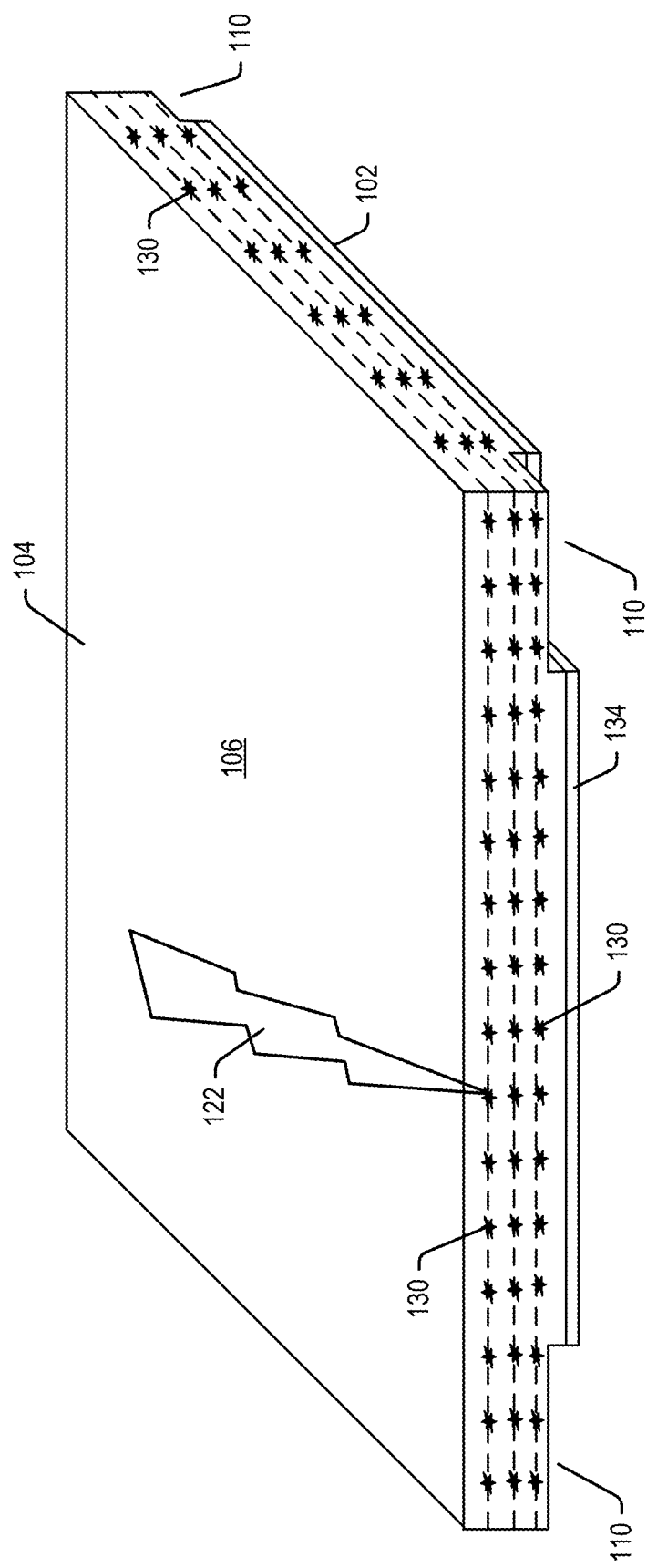

After formation of the grooves 110, a layer of tape may be laminated onto the major surface 102 in step 210. The wafer 100 may then be turned over, and diced in step 212. As noted, embodiments of the present technology dice the wafer 100 using an SDBG step, as shown in FIGS. 7 and 8. The wafer 100 may be supported on a chuck or other support surface (not shown) with the second major surface 104 facing way from the support surface. A laser 120 may then emit a pulsed laser beam 122 at a wavelength that transmits through the second major surface 104 of the wafer 100, for example at infrared or near-infrared wavelengths. Laser 120 may be the same or different laser used to form laser grooves 110. The pulsed laser beam may be focused to a point beneath the wafer's surface 104 using an optical system, for example including one or more collimating lenses 126. When the laser beam hits a peak power density at the focal point, the wafer absorbs the energy, and a pinpoint hole 130 is created beneath the wafer's surface.

The laser may be moved along lines 114 in the scribe lines 112*a* and 112*b* in a plane of the wafer and activated at a number of points so that a number of closely situated pinpoint holes 130 are formed at an intermediate depth of the wafer (between the first and second major surfaces 102, 104 of the wafer). The rows and columns of pinpoint holes 130 define the eventual shape and outline of each semiconductor die 106 to be diced from wafer 100 as indicated by FIGS. 7 and 8. The laser may form multiple layers of pinpoint holes 130 at multiple depths as shown in FIG. 8, but there may be larger or smaller number of layers in further embodiments. While FIG. 8 appears to show a diced semiconductor die 106 for illustrative purposes, the dies 106 may still be part of wafer 100 while the stealth lasing process is performed (and pinpoint holes 130 would not in fact be visible to the eye when inspecting wafer 100).

FIG. 8 shows the laser grooves 110 formed at the corners of an individual semiconductor die 106 after dicing. In particular, the laser 120 may be applied so that the horizontal pinpoint holes 130 formed in scribe line 112*a* bisect the laser grooves 110 in the scribe lines 112*a* along SDBG separation lines 114. Thus, upon dicing, the laser grooves 110 may be formed at the corners of each individual semiconductor die 106. FIG. 8 further shows an integrated circuit layer 134 including the integrated circuits formed at the first major surface 102 of the wafer 100.

After the stealth lasing step 212, the wafer 100 may be completely diced, or one or more semiconductor dies 106 may still be affixed together. The wafer may then be thinned in step 214 using a grinding wheel (not shown) applied to the second major surface 104. The grinding wheel may thin the wafer 100 from, for example, 780 μm to its final thickness. In embodiments, the final wafer thickness may be between 25 μm and 102 μm, such as for example between 25 μm and 36 μm, or between 62 μm and 102 μm. It is understood that the wafer 100 may be thinner or thicker than this range after the backgrind step in further embodiments. In addition to thinning the wafer 100, the vibrations from the backgrind step may cause cracks at the pinpoint holes 130 to propagate toward the first and second major surfaces 102, 104 of the wafer 100 along crystalline planes to complete the dicing of any dies that may have remained connected after stealth lasing step 212. It is noted that these cracks are intended (in order to dice the individual dies 106 from the wafer 100), and are not the problematic corner cracks addressed by the present technology.

Figure 9:
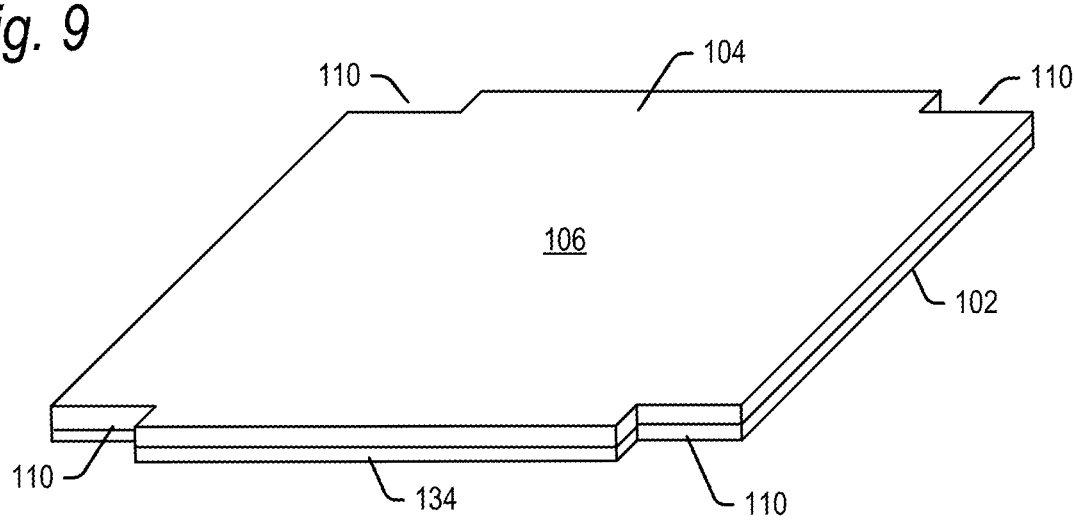
FIGS. 9 and 10 illustrate alternative embodiments of a semiconductor die within a wafer after the stealth dicing before grinding and backgrind processes.
Figure 10:
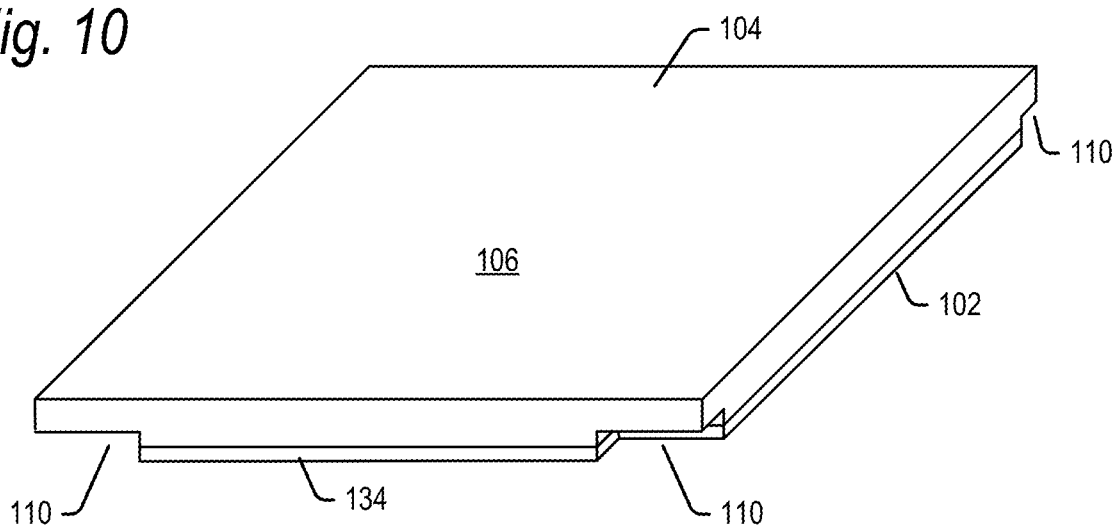

FIGS. 9 and 10 show alternative embodiments of a semiconductor die 106 thinned to its final thickness after the backgrind step 214. In FIG. 9, the depth of the laser grooves 110 formed in wafer 100 is greater than the final thickness of the wafer 100. As such, after thinning, the laser grooves are full depth (i.e., notches in the corners of the semiconductor dies 106). As noted above, where individual semiconductor dies 106 are fully separated from each other before completion of the backgrind step 214, the perturbations of the backgrind step may cause corners of adjacent semiconductor dies to move relative to each other. This movement has caused crashing, cracking and/or chipping at the corners of conventional semiconductor dies as explained in the Background section. However, formation of the laser grooves 110 in the semiconductor dies prevents dies from crashing into or contacting each other at the corners upon such relative movement. Thus, the laser grooves 110 are effective in preventing chipping and/or cracking at the corners of semiconductor dies, thus improving semiconductor dies yields.

While full depth laser grooves 110 may be preferable, it is conceivable that the depth of the laser grooves 110 formed in the wafer 100 may be less than the final thickness of the wafer 100. Such an embodiment is shown in FIG. 10. In this embodiment, the laser grooves are formed in respective semiconductor dies 106 at the first major surface 102 including the layer of integrated circuits 134. After thinning, no laser grooves exist at the second major surface 104. Thus, crashing of the corners of respective semiconductor dies 106 may occur at the second major surface 104. However, as the laser grooves 110 exist at the first major surface 102 including the layer of integrated circuits 134, the integrated circuits are protected.

After completion of the backgrind step 214, a layer of die attach film (DAF) adhered to a flexible dicing tape may be applied to a second major surface 104 of the wafer 100 in step 216. The wafer 100 may then be turned over and supported on a chuck or other support surface, and the lamination tape on the first major surface 102 of the wafer 100 may be removed in step 218. Once on the chuck, the flexible dicing tape may be stretched along orthogonal axes to separate the individual semiconductor dies 106 in step 220 to allow the individual semiconductor dies 106 to be removed by a pick and place robot for inclusion in a semiconductor package. It is conceivable that the dies 106 are not fully diced at completion of the backgrind step 214. In this event, stretching of the dicing tape in step 220 will complete dicing of the semiconductor dies along the SDBG separation lines 114.

Figure 11:
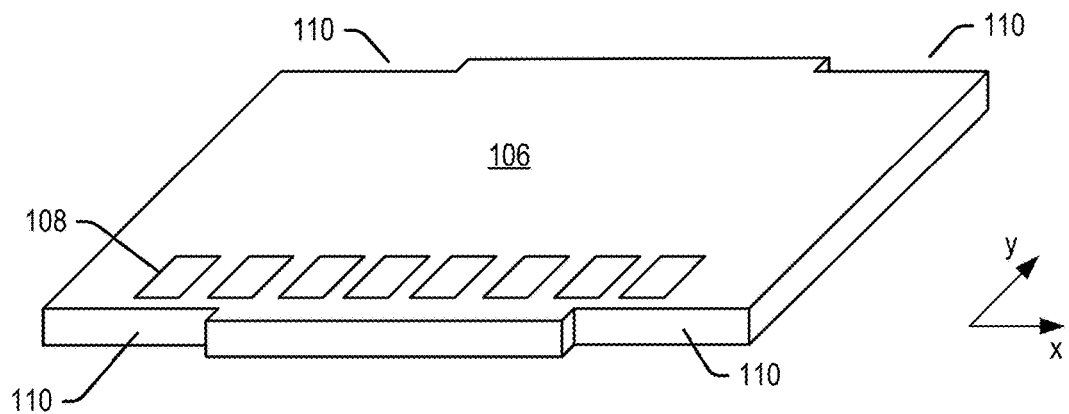
FIG. 11 illustrates a perspective view of a semiconductor die fabricated according to embodiments of the present technology.

FIG. 11 shows a semiconductor dies 106 after separation from wafer 100. The laser grooves are shown in four corners of the semiconductor dies 106. It is conceivable that the laser grooves be provided in wafer 100 such that the laser grooves are formed in one, two or three corners of the finished semiconductor dies 106 in further embodiments.

Figure 12:
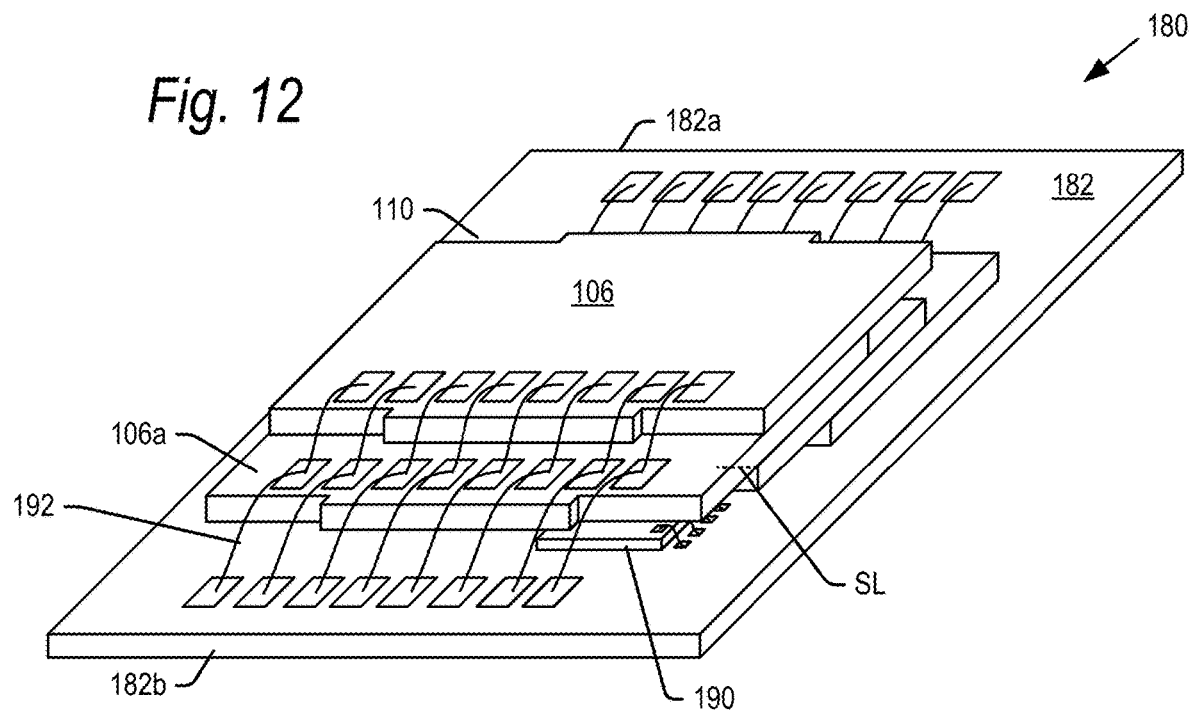
FIG. 12 is a semiconductor package including semiconductor dies fabricating according to embodiments of the present technology.

FIG. 12 shows a semiconductor package 180 including a stack of semiconductor dies 106 formed according to the present technology. The stack is shown as including four semiconductor dies 106, but the stack may include less than four or more than four semiconductor dies 106 in further embodiments, including for example eight, sixteen, thirty-two or sixty-four semiconductor dies. The semiconductor dies are shown mounted on a substrate 182, though the semiconductor dies may be formed in a chip scale package without a substrate in further embodiments.

In embodiments, the semiconductor package 180 may further include a controller die 190, such as an ASIC, mounted directly to the substrate (as shown) or mounted on top of the semiconductor die stack. The dies 106 and/or controller die 190 may be wire bonded to the substrate using bond wires 192 or electrically connected by other means. The semiconductor package 180 may be encapsulated in molding compound (not shown) to complete the package.

It is typical to stack semiconductor dies on a substrate such that one or more of them overhang empty space. In FIG. 12, the bottommost two dies 106 have their bond pads 108 facing a first end 182a of the substrate 182. A third semiconductor die, die 106a, is stacked on top of the bottommost two dies but has the bond pads 108 facing toward a second end of the substrate 182b opposite the first end. As shown, the dies 106 are offset from each other, and the bond pads 108 of die 106a overhang empty space, i.e., the bond pads 108 of die 106a are not supported on top of a die below it. Thus, while all dies are supported along their long edges, die 106a includes a short edge with the bond pads 108 that is not supported from beneath.

As noted in the Background section, dies (106a) having overhanging short edges undergo larger stresses than dies supported from beneath, for example during the wire bond and/or encapsulation processes. Where such dies have been lased or otherwise processed along the short edge to remove the ONON layers from the short edge, this has resulted in heat-affected zones (HAZ) at the short edge. Cracks develop at these HAZ areas which result in die cracking and chipping at the short edge, especially for overhanging dies, when the dies are stressed as during wire bond or encapsulation.

It is therefore an advantage of the present technology to provide the laser groove along the long edge of the semiconductor dies, and not the short edge. Provision of the laser groove along the long edge removes the ONON layers and prevents die crashing and cracking for example during the backgrind step. At the same time, omitting the laser grooves along the short edge prevents the formation of HAZ areas on the front edge, and again prevents die cracking for example during wire bond or encapsulation. While omission of the laser (or other) groove from the short edge provides the advantages described above, it is not an essential feature of the present technology.

As noted above, the optimal length of a laser groove 110 may be 1400 µm to 1800 µm, such as for example 1600 µm. The length of a laser groove 110 may be evenly split between two adjacent semiconductor dies aligned along the y-axis, so the laser groove in each die after dicing may extend from the corner 700 µm to 900 µm, such as for example 800 µm along the long edge(s) of a semiconductor die 106. This size groove was experimentally determined to optimally provide a sufficient groove to prevent die crashing and cracking, while at the same time minimizing the amount of HAZ generated by the laser. However, as noted, the length of the laser groove 110 may be smaller or larger than this range in further embodiments.

FIG. 3 is merely illustrative, but generally, there will be more vertical scribe lines 112a than horizontal scribe lines 112b in wafer 100, given that the width of the dies 106 is smaller than the length of the dies 106. As such, it is a further advantage of the present technology to remove the ONON portions in the vertical scribe lines 112a with the laser grooves 110, as there are more vertical scribe lines. The result is that more ONON portions are removed as compared to an example where the ONON portions were removed from the horizontal scribe lines 112b.

In summary, an example of the present technology relates to a semiconductor wafer having an x-axis and a y-axis, the semiconductor wafer comprising: a plurality of semiconductor dies comprising integrated circuits, each of the plurality of semiconductor dies comprising a length oriented along the y-axis and a width oriented along the x-axis, the length being longer than the width; a first set of scribe lines oriented along the y-axis between adjacent semiconductor dies of the plurality of semiconductor dies; a second set of scribe lines oriented along the x-axis between adjacent semiconductor dies of the plurality of semiconductor dies; a plurality of grooves formed in the first set of scribe lines oriented along the y-axis, the plurality of grooves extending along a first portion the length of a first semiconductor die of the plurality of semiconductor dies, and along a second portion of a second semiconductor die of the plurality of semiconductor dies, the second semiconductor die being adjacent to the first semiconductor die along the y-axis.

In a further example, the present technology relates to a semiconductor die formed from a semiconductor wafer, the semiconductor die comprising: a first major surface; a second major surface opposed to the first major surface; a length defined by long edges of the semiconductor die; a width defined by short edges of the semiconductor die, the length being greater than the width; an active area on the first major surface including integrated circuits; a border surrounding the active area along the long and short edges of the semiconductor die; and one or more grooves formed within the border and extending from one or more corners of the semiconductor die along a portion of one or both long edges of the semiconductor die, the one or more grooves configured to prevent damage to the semiconductor die.

In another example, the present technology relates to a semiconductor die formed from a semiconductor wafer, the semiconductor die comprising: a first major surface; a second major surface opposed to the first major surface; a length defined by long edges of the semiconductor die; a width defined by short edges of the semiconductor die, the length being greater than the width; an active area on the first major surface including integrated circuits; a border surrounding the active area along the long and short edges of the semiconductor die; and means for preventing damage to the semiconductor die within the border and extending from one or more corners of the semiconductor die along a portion of one or both long edges of the semiconductor die The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor wafer having an x-axis and a y-axis, the semiconductor wafer comprising:
   a plurality of semiconductor dies comprising integrated circuits, each of the plurality of semiconductor dies comprising a length oriented along the y-axis and a width oriented along the x-axis, the length being longer than the width;
   a first set of scribe lines oriented along the y-axis between adjacent semiconductor dies of the plurality of semiconductor dies;
   a second set of scribe lines oriented along the x-axis between adjacent semiconductor dies of the plurality of semiconductor dies;
   a plurality of grooves formed in the first set of scribe lines oriented along the y-axis, the plurality of grooves extending along a first portion the length of a first semiconductor die of the plurality of semiconductor dies, and along a second portion of a second semiconductor die of the plurality of semiconductor dies, the second semiconductor die being adjacent to the first semiconductor die along the y-axis;
   wherein a groove of the plurality of grooves is formed to a depth which is greater than a thickness of the semiconductor wafer after the semiconductor wafer is thinned to its final thickness.

2. The semiconductor wafer of claim 1, wherein the second set of scribe lines are devoid of the plurality of grooves, except where the first set of scribe lines cross the second set of scribe lines.

3. The semiconductor wafer of claim 1, wherein the plurality of grooves comprise a plurality of laser grooves formed by a laser.

4. The semiconductor wafer of claim 1, wherein the plurality of grooves comprise a plurality of grooves formed by photolithography.

5. The semiconductor wafer of claim 1, wherein the length of a groove of the plurality of grooves is 1400 microns to 1800 microns.

6. The semiconductor wafer of claim 1, wherein the length of the groove intersects a scribe line of the second set of scribe lines.

7. The semiconductor wafer of claim 1, wherein a width of a groove of the plurality of grooves is 50% to 100% of a width of a scribe line of the first set of scribe lines.

8. A semiconductor die formed from a semiconductor wafer, the semiconductor die comprising:
   a first major surface;
   a second major surface opposed to the first major surface;
   a length defined by long edges of the semiconductor die;
   a width defined by short edges of the semiconductor die, the length being greater than the width;
   an active area on the first major surface including integrated circuits;
   a border surrounding the active area along the long and short edges of the semiconductor die; and
   one or more grooves formed within the border and extending from one or more corners of the semiconductor die partially along one or both long edges of the semiconductor die, the one or more grooves configured to prevent damage to the semiconductor die.

9. The semiconductor die of claim 8, wherein the short edges of the semiconductor die are devoid of the one or more grooves, except where the short edges meet the long edges.

10. The semiconductor die of claim 8, wherein the one or more grooves comprise a pair of grooves along portions of both of the long edges of the semiconductor die.

11. The semiconductor die of claim 8, wherein the one or more grooves comprise a plurality of laser grooves formed by a laser.

12. The semiconductor die of claim 8, wherein a groove of the one or more grooves is formed to a full thickness of the semiconductor die.

13. The semiconductor die of claim 8, wherein a groove of the one or more grooves is formed in the first major surface to a depth which is less than a thickness of the semiconductor die.

14. The semiconductor die of claim 8, wherein the length of a groove of the one or more grooves is 700 microns to 900 microns.

15. A semiconductor die formed from a semiconductor wafer, the semiconductor die comprising:
   a first major surface;
   a second major surface opposed to the first major surface;
   a length defined by long edges of the semiconductor die;
   a width defined by short edges of the semiconductor die, the length being greater than the width;
   an active area on the first major surface including integrated circuits;
   a border surrounding the active area along the long and short edges of the semiconductor die; and
   means for preventing cracking of the semiconductor die within the border and extending from one or more corners of the semiconductor die partially along one or both long edges of the semiconductor die.

* * * * *